United States Patent [19]

Tanoi

[11] Patent Number: 4,924,440
[45] Date of Patent: May 8, 1990

[54] MOS GATE ARRAY DEVICES
[75] Inventor: Satoru Tanoi, Tokyo, Japan
[73] Assignee: Oki Electric Industry Co., Ltd., Tokyo, Japan
[21] Appl. No.: 189,161
[22] Filed: May 2, 1988
[30] Foreign Application Priority Data
  Apr. 30, 1987 [JP] Japan ................. 62-104465
[51] Int. Cl.⁵ ............ G11C 7/00; H03K 19/177
[52] U.S. Cl. ................ 365/189.08; 365/189.11; 307/465; 340/825.83
[58] Field of Search ............ 365/189.08, 189.11; 307/465, 468; 364/716; 340/825.83
[56] References Cited
U.S. PATENT DOCUMENTS
3,566,153  2/1971  Spencer, Jr. .................. 307/468
4,508,977  4/1985  Page et al. .................. 364/716 X
4,546,273  10/1985  Osman ..................... 364/716 X FOREIGN PATENT DOCUMENTS
59-225615  12/1984  Japan .

Primary Examiner—Joseph A. Popek
Attorney, Agent, or Firm—Wenderoth, Lind & Ponack

[57] ABSTRACT

A MOS gate array has a PLA formed in a memory area which includes a plurality of first and second elementary unit circuits. The first elementary unit circuit includes two output lines, one input line, two PMOS transistors, and four NMOS transistors. The second elementary unit circuit includes two input lines, an output line, two PMOS transistors, and four NMOS transistors. Input lines are formed to extend substantially perpendicularly to the output lines. Thus, the PLA is constructed so as to have a high degree of integration.

5 Claims, 8 Drawing Sheets

MOS GATE ARRAY DEVICES

BACKGROUND OF THE INVENTION

1. Field of the Invention

The present invention relates to an MOS gate array device and, more particularly, to an MOS gate array device having a special area for forming a memory.

2. Description of the Prior Art

The function of MOS gate arrays has been diversified in recent years and an MOS gate array having a special area for forming a memory, namely, a storage area, in addition to a logic area has been developed.

In an MOS gate array, a plurality of MOS transistor areas are formed in a regular arrangement on the surface of a silicon substrate so that a memory IC can be formed readily by only wiring metal lines. The logic area has MOS transistor areas and wiring areas which are so arranged that various logic ICs can readily be formed by only wiring metal lines on the surface of the silicon substrate.

When a memory, for example, a RAM, having a small storage capacity is formed in the storage area of the conventional MOS gate array, most portions of the storage area becomes useless deteriorating plane availability. Attempts have been made to form a logic IC in the unused additional storage area.

Generally, it is impossible to form a logic IC in the storage area because the logic IC requires complicated metal wiring. Forming a memory IC in the logic area is desadvantageous because the degree of circuit integration is deteriorated.

However, it is comparatively easy to form a PLA (programmable logic array) circuit as a logic circuit having an AND array plane and an OR array plane in the storage area by wiring metal lines.

Japanese Patent Laid-Open Publication No. 59-225615 discloses a technique to constitute a PLA circuit by suitably connecting elements formed in a RAM forming area.

According to the prior art, a plurality of basic unit circuits areas 4 each comprising, for example, six MOS transistors P1, P2, N1, N2, N3 and N4 in a memory area of a gate array as shown in FIG. 7(a) are formed previously in a regular arrangement.

As shown in FIG. 7(b), the basic unit circuit 4 constituting a 6-transistor memory cell of a SRAM IC is formed by forming bit lines 10 and 11, a word line 12 and a ground line by using metal layers.

As shown in FIG. 6, the SRAM IC includes an address decoder area 1, a storage element matrix area 2 and a data control area 3. The storage element matrix area 2 can be formed by efficiently using the storage space by connecting the respective bit lines 10 and 11, and word lines 12 of the plurality of basic unit circuits 4 by wiring metal lines.

However, in forming a PLA circuit by the basic unit circuits in the storage area of a MOS gate array, the basic unit circuits 4a and 4b are formed in the same metal wiring pattern as shown in FIG. 8. Therefore, a wiring 26 along a roundabout route is necessary for connecting the output 10a of the basic unit circuit 4a with the input 12b of the basic unit circuit 4b.

Furthermore, in a PLA circuit shown in FIG. 9, an AND array plaane comprises an input circuit 20 and a first NOR plane 21, while an OR array plane comprises pull-up circuits 23 and 24, an output circuit 25 and a second NOR plane 22.

As shown in FIG. 8, a wiring metal line 26 extending along a roundabout route is necessary for connecting the output of the AND array with the input of the OR array plane.

As evident from the foregoing description, the conventional PLA using the RAM space of the MOS gate array cannot be formed in a compact construction eliminating space for wiring.

SUMMARY OF THE INVENTION

Accordingly, it is an object of the present invention to provide a MOS gate array including a high-density PLA formed in the RAM space thereof and eliminating the foregoing problems in the conventional MOS gate aray.

To achieve the object of the invention, the present invention provides a MOS gate array which includes a PLA formed in a memory area comprising an input line extending substantially perpendicularly to the output lines, characterized in that the elementary unit circuits are a plurality of first elementary unit circuits each using output lines extending in one direction and a plurality of second elementary unit circuits each using output lines extending in one direction and an input line extending substantially perpendicularly to the output lines.

Also, the present invention provides a MOS gate array having a PLA circuit which comprises a silicon substrate having a storage area prepared on one major surface thereof for forming a memory circuit therein, a plurality of unit circuit areas formed in the storage area, and at least one MOS transistor circuit formed in the unit circuit area; a first basic unit circuit comprising wiring metal layers formed at least in one of the unit circuit areas, and a pair of output lines formed of metal layers; and a second basic unit circuit comprising wiring metal layers formed at least in one of the unit circuit areas, an output line formed on a metal layer, a first input line formed of a metal layer, and a second input line formed in a metal layer.

The above and other objects, features and advantages of the present invention will become apparent from the following description taken in conjunction with the accompanying drawings.

BRIEF DESCRIPTION OF THE DRAWINGS

In the drawings like reference numerals denote like or corresponding parts throughout.

DESCRIPTION OF THE PREFERRED EMBODIMENTS

Figure 7A:
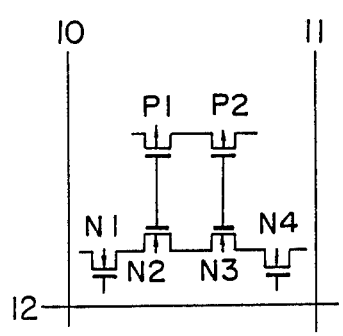
FIGS. 7(a) and 7(b) are wiring diagrams of the elementary unit circuit of a conventional RAM.
Figure 7B:
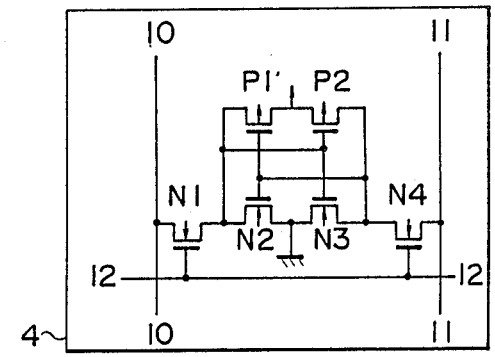
Figure 8:
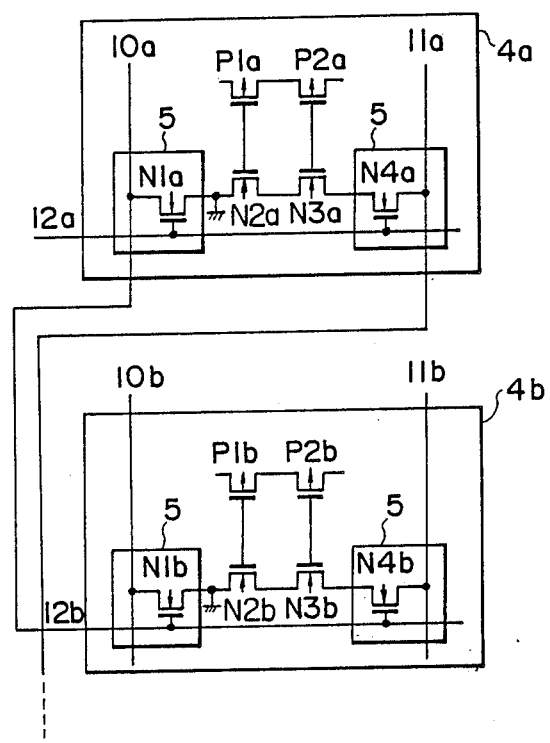
FIG. 8 is a wiring diagram showing a portion of a conventional PLA.

A silicon substrate having a storage area, for example, a SRAM area, comprising a plurality of unit circuit areas as shown in FIG. 7(a) is prepared for forming a MOS gate array according to the present invention.

As shown in FIG. 7(a), the unit circuit area comprises a PMOS series circuit consisting of PMOS transistors P1 and P2, and an NMOS series circuit consisting of NMOS transistors N1, N2, N3 and N4.

Generally, the respective gates of the MOS transistors are connected by doped polycrystalline silicon lines, and the respective sources of the same are connected by diffused layers.

Figure 6:
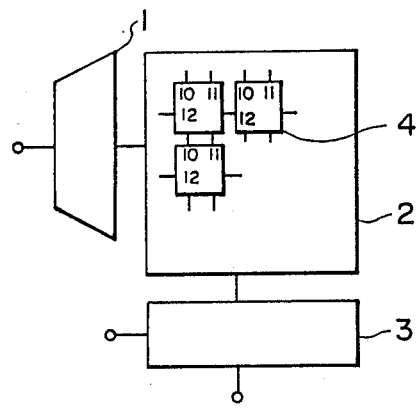
FIG. 6 is a block diagram of a RAM included in a conventional MOS gate array.

Two kinds of wiring metal lines according to the present invention are formed in the unit circuit area of FIG. 6(a) to form a PLA circuit in the storage area.

Figure 1A:
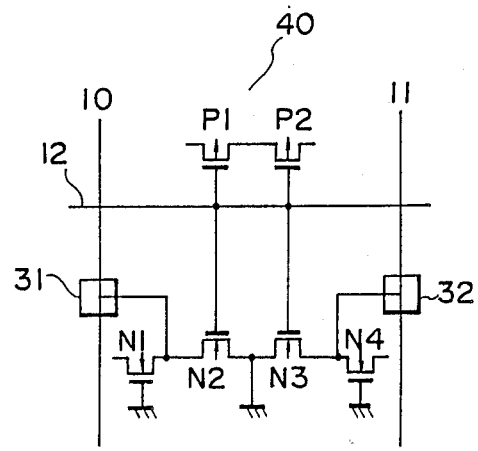
FIGS. 1(a) and 1(b) are wiring diagrams of elementary unit circuits embodying the present invention.

FIG. 1(a) shows a first basic unit circuit according to the present invention. Wiring metal layers are formed between the ground potential and the respective sources of NMOS transistors N2 and N3, and between the ground potential and the respective gates of NMOS transistors N1 and N4.

A wiring metal layer is formed as an input line 12 of a PLA connected to the respective gates of the NMOS transistors N2 and N3. The input line 12 corresponds to the word line of a SRAM circuit.

A pair of wiring metal layers are formed substantially perpendicularly to the input line 12 as a pair of output lines 10 and 11 of the PLA. The output lines 10 and 11 corresponds to a pair of bit lines of the SRAM circuit.

The drain of the NMOS transistor N2 and a functional point 31, and the drain of the NMOS transistor N3 and a functional point 32 are connected selectively by metal layers according to the program of the PLA.

In FIG. 1(a), the first basic unit circuit 40 is substantially a NOR gate comprising the NMOS transistors N2 and N3.

Figure 1B:
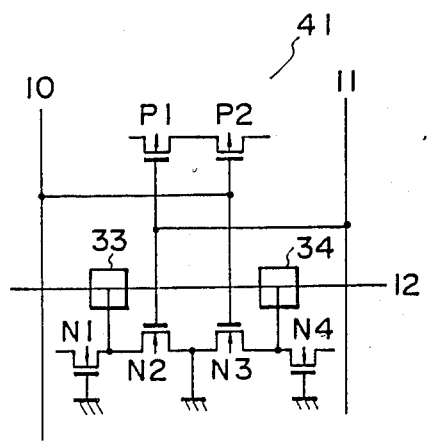

FIG. 1(b) shows a second basic unit circuit according to the present invention, in which wiring metal layers are formed respectively between a ground potential and the sources of NMOS transistors N2 and N3 and between the ground potential and the gates of NMOS transistors N1 and N4.

A wiring metal layer as an output line 12 is connected selectively to the respective drains of the NMOS transistors N2 and N3 though functional points 33 and 34, respectively, according to the program of a PLA. The output line 12 corresponds to the lead line of a SRAM circuit.

Wiring metal layers are formed perpendicularly to the output line 12 as a pair of input lines 10 and 11, which are connected respectively to the respective gates of the NMOS transistors N2 and N3. The input lines 10 and 11 corresponds to the bit lines of the SRAM circuit.

After all, the second basic unit circuit 41 shown in FIG. 1(b) is a NOR gate comprising the NMOS transistors N2 and N3.

Figure 2:
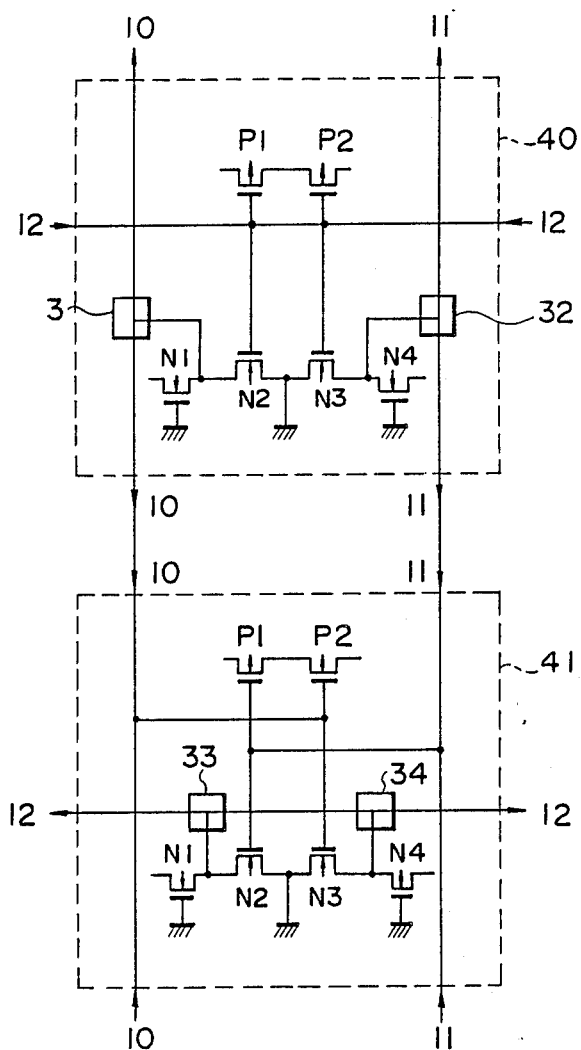
FIG. 2 is a wiring diagram showing a portion of a PLA according to the present invention.

As apparent from the foregoing description, according to the present invention, the PLA circuit comprising the first and second basic unit circuits as shown in FIG. 2 can be formed without extending wiring metal lines along a roundabout route.

In FIG. 1(b), the input line 10 and the input line 11 may be connected respectively to the gate of the PMOS transistor P2 and the gate of the PMOS transistor P1.

Figure 3:
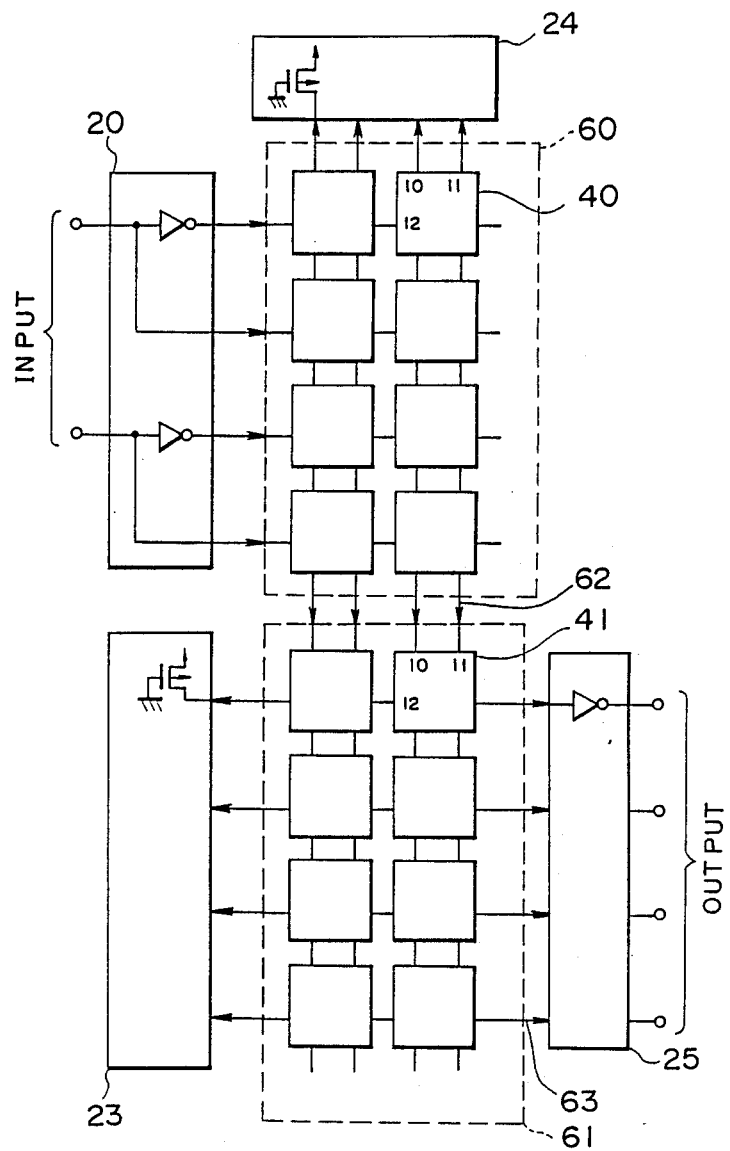
FIGS. 3, 4 and 5 are block diagrams respectively of MOS gate arrays, in first, second and third embodiments, according to the present invention.
Figure 4:
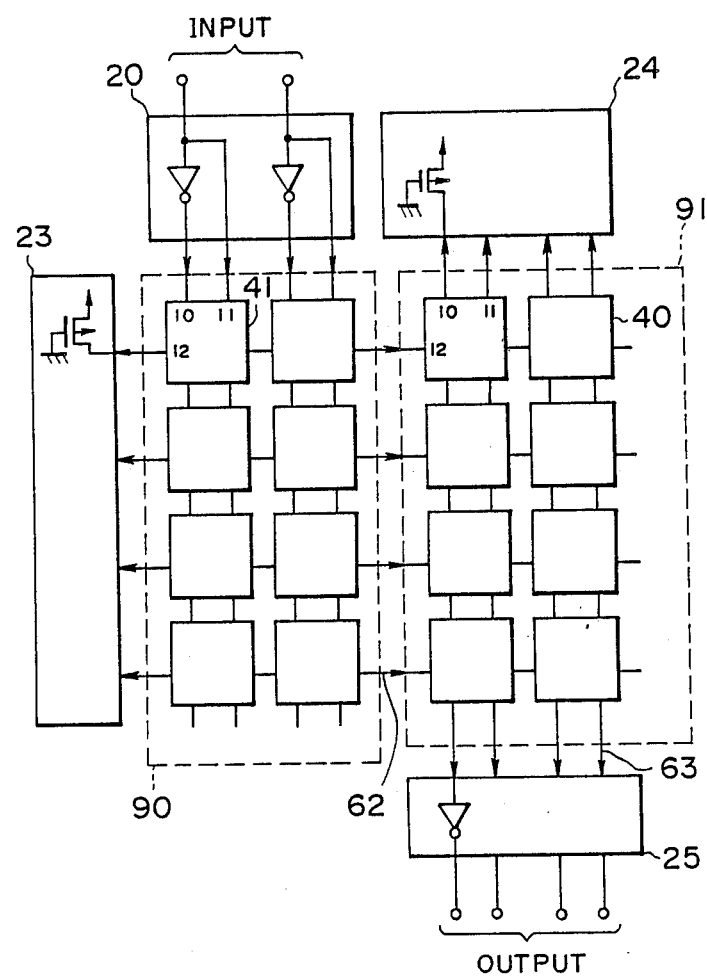
Figure 5:
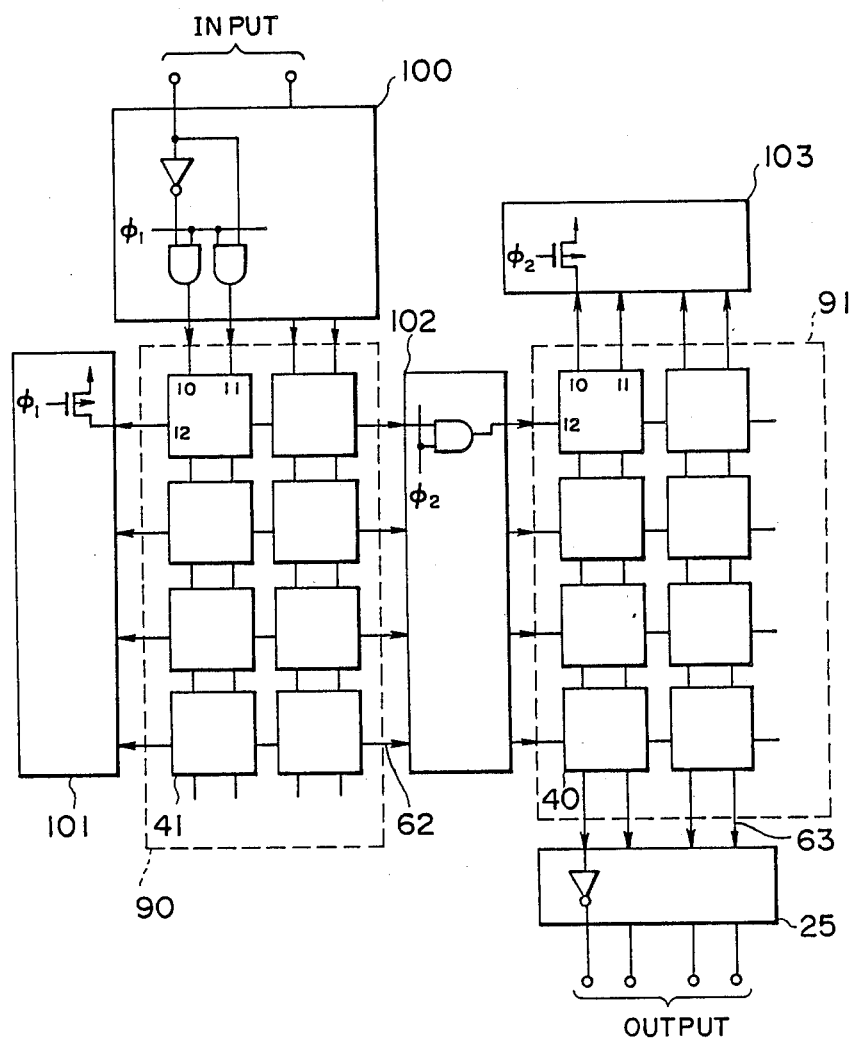
Figure 9:
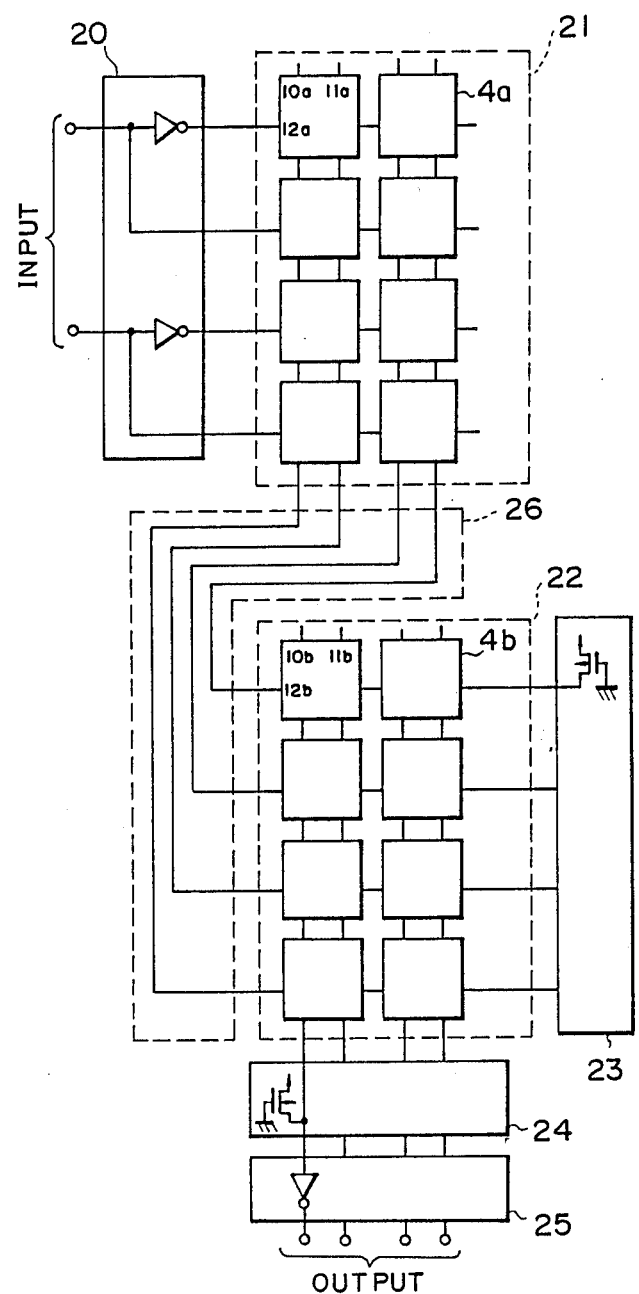
FIG. 9 is a block diagram of a conventional PLA.

PLAs each employing the first elementary unit circuit 40 and the second elementary unit circuit 41 embodying the present invention are shown respectively in FIGS. 3, 4 and 5, in which two-input four-output PLAs are formed in contrast with the conventional PLA shown in FIG. 9.

A PLA incorporated into a MOS gate array, in a first embodiment, according to the present invention will be described with reference to FIG. 2, in which parts similar to those previously described with reference to FIG. 9 are denoted by the same reference numerals and the description thereof will be omitted.

The asynchronous PLA of FIG. 3 has a first NOR gate plane 60 and a second NOR gate plane 61, which are different respectively from the first NOR gate plane 21 and the second NOR gate plane 22 of FIG. 9. The first NOR gate plane 60 comprises a regular longitudinal arrangement of a plurality of the first elementary unit circuits 40. The second NOR gate plane 61 comprises a regular longitudinal arrangement of a plurality of the second elementary unit circuits 41.

The first NOR gate plane 60 receives input signals given by an input circuit 20 and provides output signals to the input lines of the NOR gate plane 61 through logical product lines 62. The output signals are pulled up by a pull-up circuit 24. The outputs of the NOR gate plane are connected to a pull-up circuit 23 and to an output circuit 25. The output circuit 25 inverts the outputs of the NOR gate plane 61 to provide the output of the PLA.

In FIG. 3, the input circuit 20, the pull-up circuit 24, the first NOR gate plane 60 form the AND array plane, while the pull-up circuit 23, the output circuit 25, the second NOR gate plane 61 form the OR array plane.

In the first NOR gate plane 60, the input lines 12 of the first elementary unit circuits 40 of each row are commonly connected and the output lines 10 and 11 of the first elementary unit circuits 40 of each column are commonly connected so as to serve as the logical product lines 62. In the NOR gate plane 61, the input lines 11 and the second elementary unit circuits 41 of each row are commonly connected, and the output lines 12 of the second elementary unit circuits 41 of each column are commonly connected so as to serve as the logical sum line 63.

The logical product lines 62 are formed by straight extending and interconnecting the output lines of the first NOR gate plane 60 and the input lines of the second NOR gate plane 61.

Since the PLA according to this invention does not require any circuitous wirings and multi-layered structure for crossing, it can be formed in a high density without requiring a large wiring space.

An elementary unit circuit formed for use in an asynchronous RAM has generally the transistors N2 and N3 having greater saturation current characteristics. In this embodiment, since the transistors N2 and N3 of the first elementary unit circuits 40 and the second elementary unit circuits 41 are used for driving the output lines of the arrays, the operating speed of the PLA is enhanced.

Referring to FIG. 4 showing an asynchronous PLA, in a second embodiment, according to the present invention, a first NOR gate plate 90 comprises a plurality of the second elementary unit circuits 41, and the second NOR gate plane 91 comprises a plurality of the first elementary circuits 40. That is, the first NOR gate plane 60 and the second NOR gate plane 61 of the first embodiment correspond respectively to the second NOR gate plane 91 and the first NOR gate plane 90 of the second embodiment. The input lines correspond to the bit lines 10 and 11 of the SRAM IC. The logical product lines 62 correspond to the word lines 12 of the SRAM ICs, and are connected to the input lines 12 of the first elementary unit circuit 40, namely, the input lines of the NOR gate plane 91. The logic sum lines 63, namely, the output lines of the second NOR gate plane 91 correspond to the bit lines 10 and 11 of the SRAM IC. The functions of the second embodiment are the same as those of the first embodiment, and hence the description thereof will be omitted. The second embodiment, similarly to the first embodiment, provides a high-density and high-speed PLA.

FIG. 5 shows a synchronous PLA in a third embodiment, according to the present invention. Basically, the third embodiment is almost the same as the second embodiment in constitution, and hence the detailed description of the constitution thereof will be omitted.

In the third embodiment, an input circuit 100 applies the logical product of a first periodic signal $\phi 1$ and an input signal to a first NOR gate plane 90. A precharge circuit 101 activates or inhibits the output lines of the first NOR gate plane 90 by the first periodic signal $\phi 1$. A buffer circuit 102 applies to the second NOR gate plane 91 the logical product of the output signal of the first NOR gate plane 90 provided on the logical product line 62 and a second periodic signal $\phi 2$. A precharge circuit 103 activates or inhibits output lines of the second NOR gate plane 91 by the second periodic signal $\phi 2$. The second NOR gate plane 91 applies the outputs through a logical sum line 63 to an output circuit 25.

Thus, the synchronous PLA needs the buffer circuit 102 between the first NOR gate plane 90 and the second NOR gate plane 91. However, since the buffer circuit 102 can be expanded in accordance with the number of output lines of the first gate plane 90, the PLA does not require any circuitous wiring paths, thus being able to be formed in a high density.

Furthermore, since the first and second elementary unit circuits can use the transistors of the memory holding unit having high element ability, the output lines of the logical arrays can be driven by the transistors having high element ability for the high-speed operation of the PLA.

The MOS gate array according to the present invention can easily construct a highly functional circuit, such as a processor including a high-density high-speed PLA for a RAM and an instruction decoder. Moreover, since a high-density PLA can be constructed in an unused RAM space, it can be substituted for a part of the logic of the user circuit. Therefore, the elements in an unused RAM space can effectively utilize and can substantially increase the density of the MOS gate array.

Although the invention has been described in its preferred forms with a certain degree of particularity, obviously many changes and variations are possible therein. It is therefore to be understood that the present invention may be practiced otherwise than specifically described herein without departing from the scope and spirit thereof.

What is claimed is:

1. A programmable logic array formed in a first area of a gate array, the gate array having a plurality of memory cells in a second area thereof which is adjacent to the first area, said memory cells respectively having a first transistor group including a plurality of transistors, said transistors in said first transistor group being arranged in a memory formation which is suitable for forming said memory cell therein, the programmable logic array comprising:
   a first array having a plurality of first input terminals extending in a first direction and having a plurality of first output terminals extending in a second direction substantially perpendicular to said first direction;
   a first pull-up circuit connected to said first output terminals;
   said first array having a plurality of first cells, said first cells each having a second transistor group including a plurality of transistors, said transistors in said second transistor group being arranged in the memory formation and being coupled to one another so that said first array connected to said first pull-up circuit forms a first NOR circuit;
   a second array haaving a plurality of second input terminals extended in said second direction and having a plurality of second output terminals extending in said first direction; and
   a second pull-up circuit connected to said second output terminals;
   said second array having a plurality of second cells, said second cells each having a third transistor group including a plurality of transistors, said transistors in said third transistor group being arranged in the memory formation and being coupled to one another so that said second array connected to said second pull-up circuit forms a second NOR circuit differing from said first NOR circuit.

2. A programmable logic array according to claim 1, wherein said first output terminals of said first array are respectively coupled to said corresponding second input terminals of said second array.

3. A programmable logic array according to claim 2, wherein said programmable logic array has a plurality of buffers, said buffers respectively connecting said corresponding first output terminals of said first array to said corresponding second input terminals of said second array.

4. A programmable logic array according to claim 1, wherein said programmable logic array has input and output circuits, said input circuit being connected to said first input terminals of said first array such that said input circuit, first array and first pull-up circuit form an AND circuit, and said output circuit being connected to said second output terminals of said second NOR array such that said output circuit, second array and second pull-up circuit form an OR circuit.

5. A programmable logic array formed in a first are of a gate array, the gate array having a plurality of memory cells in a second area thereof which is adjacent to the first area, said memory cells having a first transistor group including four transistors connected in series, the four transistors in the first transistor group being arranged in a memory formation which is suitable for forming the memory cell, the programmable logic array comprising:
   a first array having:
      a first input line extending in a first direction;
      a pair of first output lines respectively extending in a second direction which is substantially perpendicular to said first direction, and
      a second transistor group including first, second, third and fourth transistors connected in series, said first, second, third and fourth transistors being arranged in the memory formation and provided between said first output lines;

wherein a source of each of said second and third transistors, and a gate of each of said first and fourth transistors being connected to a ground, and a drain of each of said second and third transistors being respectively coupled to corresponding first output lines, and a gate of each of said second and third transistors being selectively coupled to said input line; and a second array having:

a pair of second input lines respectively extending in said second direction;

a second output line extending in said first direction, and a third transistor group including fifth, sixth, seventh and eighth transistors connected in series, said fifth, sixth, seventh and eighth transistors being arranged in the memory formation and provided between said second input lines;

wherein a source of each said sixth and seventh transistors and a gate of each of said fifth and eighth transistors being connected to said ground, and a gate of each of said sixth and seventh transistors being respectively coupled to corresponding second input lines, and a drain of each of said sixth and seventh transistors being selectively coupled to said second output line.

* * * * *